(12) United States Patent
Visser

(10) Patent No.: US 11,005,173 B2
(45) Date of Patent: May 11, 2021

(54) ESD PROTECTION FOR ANTENNA PORT

(71) Applicant: Qorvo International PTE. LTD., Singapore (SG)

(72) Inventor: Hendrik Arend Visser, Wijchen (NL)

(73) Assignee: Qorvo International Pte. Ltd., Singapore (SG)

( * ) Notice: Subject to any disclaimer, the term of this patent is extended or adjusted under 35 U.S.C. 154(b) by 231 days.

(21) Appl. No.: 16/313,280

(22) PCT Filed: Jul. 4, 2016

(86) PCT No.: PCT/NL2016/050475
§ 371 (c)(1),
(2) Date: Dec. 26, 2018

(87) PCT Pub. No.: WO2018/009053
PCT Pub. Date: Jan. 11, 2018

(65) Prior Publication Data
US 2019/0165465 A1     May 30, 2019

(51) Int. Cl.
*H02H 9/00* (2006.01)
*H01Q 1/50* (2006.01)
*H04B 1/18* (2006.01)
*H04B 1/58* (2006.01)
*H01L 27/02* (2006.01)
*H02H 9/04* (2006.01)

(52) U.S. Cl.
CPC ........... *H01Q 1/50* (2013.01); *H01L 27/0248* (2013.01); *H01L 27/0251* (2013.01); *H02H 9/046* (2013.01); *H04B 1/18* (2013.01); *H04B 1/58* (2013.01)

(58) Field of Classification Search
None
See application file for complete search history.

(56) References Cited

U.S. PATENT DOCUMENTS

| 3,584,643 A | 6/1971 | Burke |
| 4,994,727 A | 2/1991 | Yang |
| (Continued) | | |

OTHER PUBLICATIONS

Leenaerts, Domine., et al., "Bond Pad and ESD Protection Structure for 0.25um/0.18um RF-CMOS," 29th European Solid-State Circuits Conference, Sep. 2003, IEEE, pp. 569-572.
(Continued)

*Primary Examiner* — Stephen W Jackson
(74) *Attorney, Agent, or Firm* — Withrow & Terranova, P.L.L.C.

(57) ABSTRACT

A transceiver device comprising transceiver circuitry (5) coupled to one or more antenna ports (2; 2') by a balun arrangement (Lb, Lu; Lu'). For each of the antenna ports (2; 2') an antenna switch (Ta; Ta') is present having an antenna enabling input (4; 4') and being arranged to connect an unbalanced coil (Lu; Lu') from the balun arrangement (Lb, Lu; Lu') to the antenna port (2; 2') and a ground port (3). Also an electro-static discharge (ESD) protection circuit is provided with an ESD switch (Te; Te') arranged to connect the antenna port (2; 2') to the antenna enabling input (4; 4') of the antenna switch (Ta; Ta'). The ESD switch (Te; Te') has an ESD switch control input (A) connected to an ESD trigger arrangement (Rtrigger).

8 Claims, 3 Drawing Sheets

(56) References Cited

U.S. PATENT DOCUMENTS

| | | | | |
|---|---|---|---|---|
| 8,666,330 B2* | 3/2014 | Visser | ............ | H04B 1/525 |
| | | | | 455/83 |
| 8,948,709 B2* | 2/2015 | Kwok | ............ | H04B 1/48 |
| | | | | 455/83 |
| 9,806,521 B2* | 10/2017 | Khazhinsky | ............ | H02H 9/04 |
| 2005/0007034 A1 | 1/2005 | Kobayashi et al. | | |
| 2014/0213200 A1 | 7/2014 | Brinkhoff et al. | | |

OTHER PUBLICATIONS

International Search Report and Written Opinion for PCT/NL2016/050475, dated Mar. 21, 2017, 11 pages.
International Preliminary Report on Patentability for PCT/NL2016/050475, dated Jan. 17, 2019, 8 pages.

* cited by examiner

ESD PROTECTION FOR ANTENNA PORT

This application is a 35 USC 371 National Phase filing of International Application No. PCT/NL2016/050475, filed Jul. 4, 2016, the disclosure of which is incorporated herein by reference in its entirety.

FIELD OF THE INVENTION

The present invention relates to a transceiver device comprising transceiver circuitry coupled to at least one antenna port by a balun arrangement, and for each of the at least one antenna port an antenna switch having an antenna enabling input and arranged to connect an unbalanced coil from the balun arrangement to the antenna port and a ground port, and an electro-static discharge (ESD) protection circuit.

BACKGROUND ART

Protection against electro-static discharge is becoming more and more important for integrated circuit design, also when designing RF based integrated circuits having antenna ports. In prior art implementations additional integrated circuit area is needed to incorporate ESD protection circuitry into the integrated circuit.

The article by D. Leenaerts et al. entitled 'Bond Pad and ESD Protection Structure for 0.25 um/0.18 um RF-CMOS', Proceedings of the 29th European Solid-State Circuits Conference, 2003. ESSCIRC '03, discloses a dedicated diode network ESD structure together with special bond pad configurations for application in CMOS RF integrated circuits.

SUMMARY OF THE INVENTION

The present invention seeks to provide implementing ESD protection for integrated circuits having one or more antenna ports which improves reliability of the antenna port(s) while at the same time maintaining good performance due to the absence of insertion loss.

According to the present invention, a transceiver device as defined above is provided, wherein the ESD protection circuit comprising an ESD switch arranged to connect the antenna port to the antenna enabling input of the antenna switch, the ESD switch having an ESD switch control input connected to an ESD trigger arrangement. In this arrangement, the already present antenna switch is used as a part of the ESD protection circuit. Upon an ESD event, the ESD switch will conduct, thus closing the antenna switch and using the secondary balun coil as short to ground. In this manner, a very cost-effective solution is provided to protect an antenna port of a transceiver device from electrostatic discharges. The antenna switch and ESD switch may be implemented as semiconductor devices, such as NMOS or NPN devices, allowing full integration of the ESD protection circuit in an integrated circuit. In further embodiments, the ESD trigger arrangement comprises a trigger impedance connected between either a cold side of the unbalanced coil or a hot side of the unbalanced coil and the ESD switch control input of the associated ESD switch. An ESD event on the antenna port will then be sufficient to trigger the rest of the ESD protection circuit.

In even further embodiments, the ESD protection circuit further comprising an ESD switch disable switch arranged to connect the ground port to the ESD switch control input of the associated ESD switch. This embodiment allows to disable the ESD switch, e.g. to allow high amplitude signals to be provided to the antenna port of the transceiver device in a transmit mode, without the risk of any unwanted distortion or triggering of the ESD protection circuit.

SHORT DESCRIPTION OF DRAWINGS

The present invention will be discussed in more detail below, with reference to the attached drawings, in which FIG. 1 shows a schematic diagram of an RF output stage of a transceiver device without ESD protection;

DESCRIPTION OF EMBODIMENTS

Figure 1:
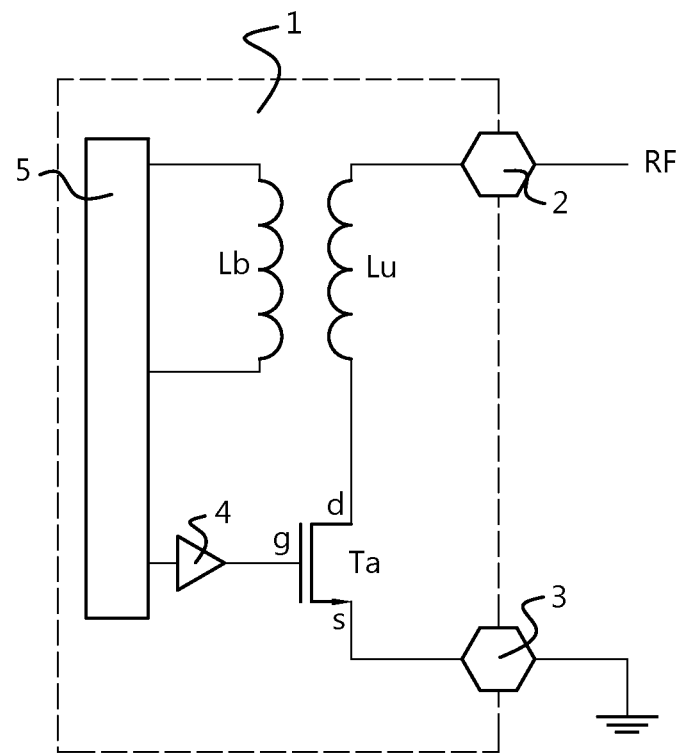

The present invention embodiments are described below with reference to a number of exemplary embodiments as shown in the drawings. The present invention embodiments offer a new way of implementing electrostatic discharge (ESD) protection for antenna ports in integrated circuits (e.g. CMOS IC's) which improves reliability of the antenna port while at the same time maintaining good performance due to the absence of insertion loss.

The present invention embodiments relate to a novel ESD protection circuit implementation re-using hardware available in an antenna switch part of a transceiver device, e.g. an antenna switch circuit that is used for antenna selection diversity. The disclosed invention has particular application in the field of ultra-low power sensor networks, but is also applicable for any wireless application that uses antenna diversity and is constrained by a power budget and cost. (e.g. ZigBee, Bluetooth, DECT, GSM, WiFi (non-MiMo standards). Sensor nodes are often required to run on a coin-cell battery for several years, which requires an ultra-low power implementation. Furthermore, the total cost of the sensor node should be very low. The cost of the sensor node is usually proportional to the amount of silicon area of the integrated circuit in combination with the chosen process technology and the amount of discrete components needed. At the same time the sensor node must be robust and not fail in the field. Despite all these constraints, the sensor nodes should have a high sensitivity and at the same time be robust against interferers and ESD events. Antenna ports 2 are sensitive nodes and ESD can be very harmful to such antenna ports 2 resulting in failing products and customer returns. It is very common that antenna ports 2 (RF ports) are the weakest spot of the whole chip from ESD perspective.

FIG. 1 shows a schematic diagram of an RF output stage of a transceiver device 1 without ESD protection. The transceiver device 1 comprises transceiver circuitry 5 coupled to at least one antenna port 2 via a balun arrangement Lb, Lu. An antenna switch Ta is present having an antenna enabling input 4 and being arranged to connect an unbalanced coil Lu from the balun arrangement Lb, Lu to the antenna port 2 and a ground port 3. A reason to add such an antenna switch Ta in the circuit connecting the unbalanced coil Lu to the antenna port 2 is to attenuate a signal and by doing so to limit loud (i.e. high amplitude) blocking signals. An unbalanced antenna signal RF is present on the antenna port 2 if the antenna switch Ta is closed. In many examples the transceiver device 1 is implemented as an integrated circuit, including the balun arrangement Lb, Lu and the antenna switch Ta (e.g. implemented as an NMOS device). The transceiver device 1 then has two possible states, as selected using the antenna switch. In the OFF mode, the antenna port 2 is not selected. The signal RF at the antenna port 2 is attenuated as no current can flow through the unbalanced coil Lu and thus cannot couple to the balanced coil Lb. There is a (limited) isolation provided by the antenna switch Ta. This can be made programmable or simple on/off. A typical attenuation number in such an implementation is 15 dB to 20 dB. In the ON mode, the on-resistance of the antenna switch Ta (NMOS device) is sub 1 Ohm. RF current can start to flow through the circuit formed by the antenna switch Ta and unbalanced coil Lu to the antenna port 2 (provided a suitable antenna is connected).

It is noted that without any supply being present to the transceiver device 1, the antenna switch Ta (NMOS device) cannot be enabled, and thus without any ESD trigger circuit, a voltage could build up across the drain-source terminals of the antenna switch Ta, which would cause unwanted behavior (e.g. destruction of devices by ESD events).

The general common feature in the present invention embodiments, is to re-use an existing RF (NMOS) switch (the antenna switch Ta of the FIG. 1 circuit) as part of the ESD protection circuit. The re-use allows unchanged small signal RF performance (such as losses, bandwidth, selectivity, impacting receiver sensitivity or transmit output power), while adding ESD protection to the antenna ports. In short the present invention embodiments allow to provide ESD protection to an antenna port 2 without adding a standard ESD protection block.

Figure 2:
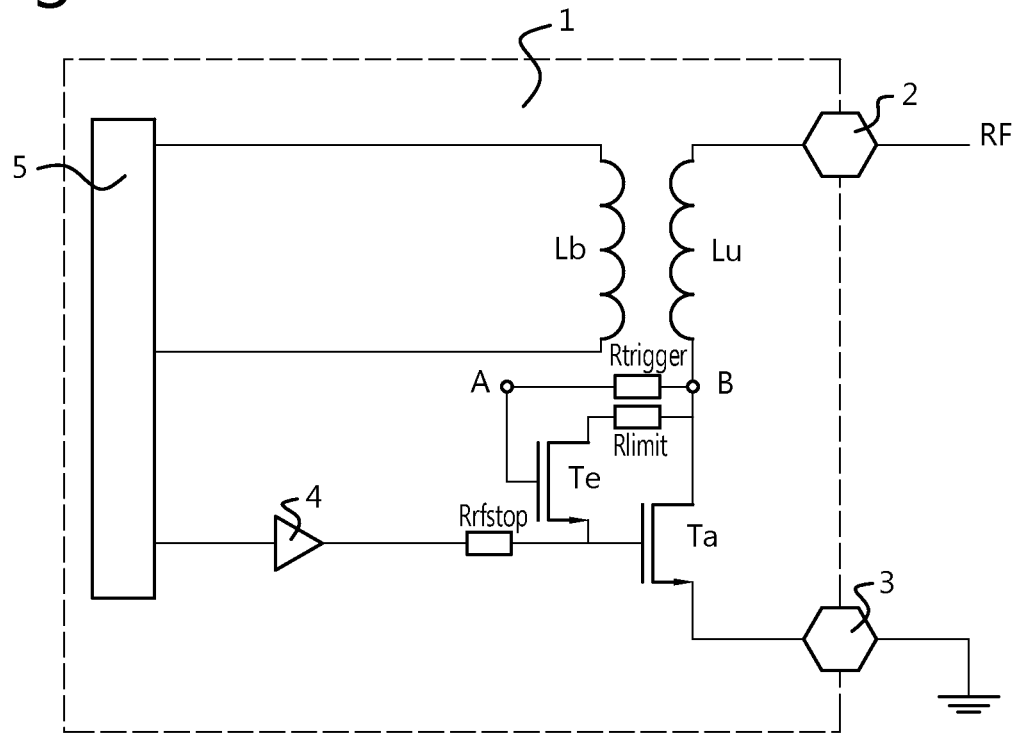
FIG. 2 shows a schematic diagram of a transceiver device provided with an ESD protection circuit according to an embodiment of the present invention.
Figure 3:
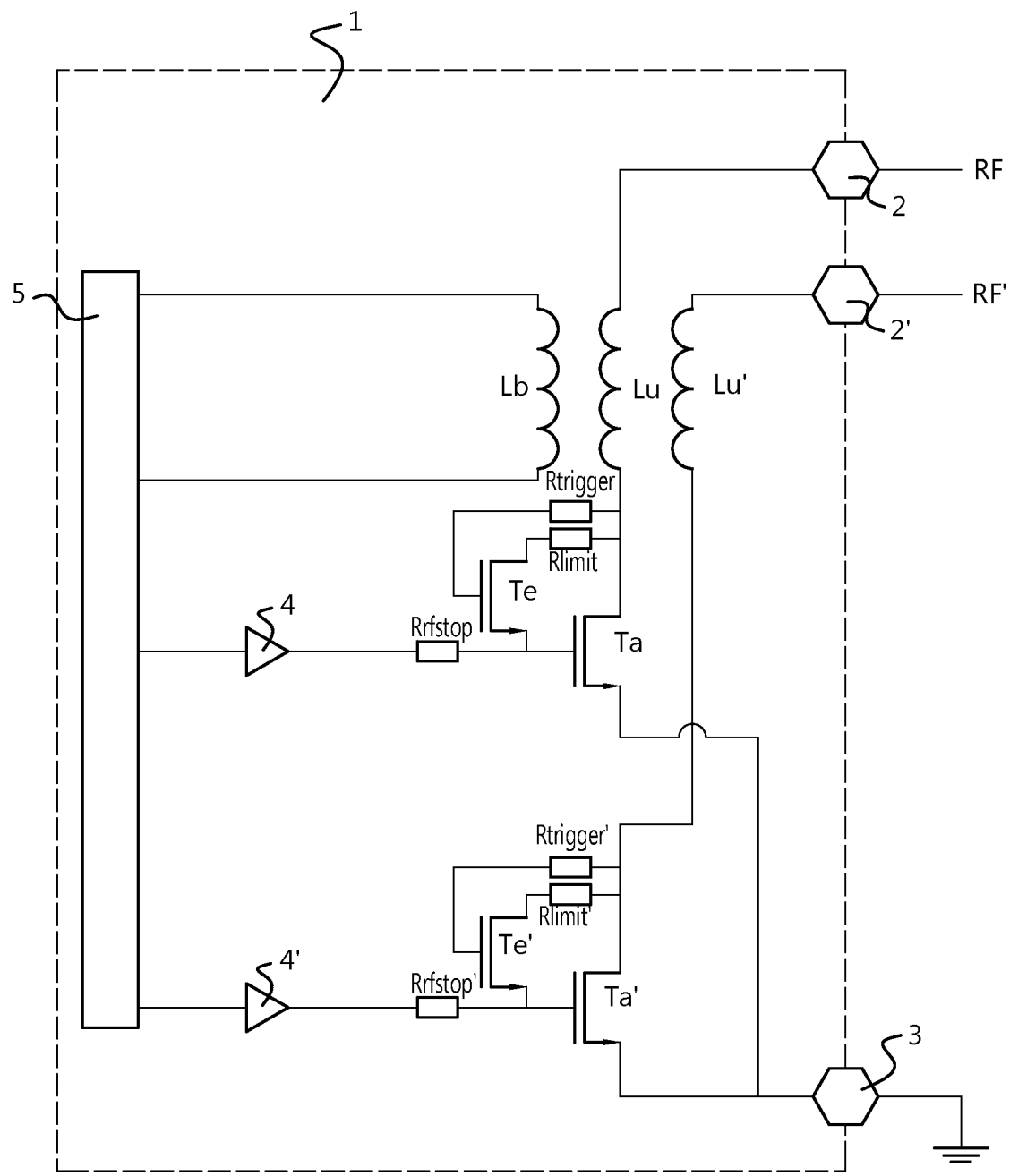
FIG. 3 shows a schematic diagram of a transceiver device with an antenna diversity arrangement provided with an ESD protection circuit according to a second embodiment of the present invention.

In a generic embodiment (see all embodiments as shown in FIG. 2-5), the transceiver device 1 thus further comprises an electro-static discharge (ESD) protection circuit, the ESD protection circuit comprising an ESD switch Te; Te' arranged to connect the antenna port 2; 2' to the antenna enabling input 4; 4' of the antenna switch Ta; Ta', the ESD switch Te; Te' having an ESD switch control input A connected to an ESD trigger arrangement. Effectively, the antenna switch Ta; Ta' is then a part of the ESD protection circuit. It is noted that FIG. 3 shows an antenna diversity embodiment wherein some components are present in a plural sense, as indicated by the apostrophe reference numerals in this description.

FIG. 2 shows a schematic diagram of a transceiver device 1 provided with an ESD protection circuit according to an embodiment of the present invention. In this embodiments, the ESD trigger arrangement comprises a trigger impedance Rtrigger connected between a cold side B of the unbalanced coil Lu and the ESD switch control input A of the associated ESD switch Te. The ESD switch control input A is in this exemplary embodiment formed by the gate of an NMOS device implementation of the ESD switch Te. In a general sense, the switches as described in relation to the exemplary embodiments can be semiconductor devices, e.g. N-type semiconductor devices such as NPN or NMOS devices. This solution re-uses an already present coil (unbalanced coil Lu) and an RF NMOS switch (antenna switch Ta) as core of the ESD protection circuit implementation, thus not impacting losses in receive or transmit mode of the transceiver device 1, not impacting area and not impacting large signal behavior. The ESD functionality is added in this embodiment by a very simple trigger circuit. The cold side B of the unbalanced coil Lu is used to trigger the ESD switch Te via trigger impedance Rtrigger. The already present unbalanced coil Lu acts as a short with the already present NMOS antenna switch Ta to ground port 3. The added ESD switch Te acts as a current conducting circuit under control of a trigger input to the gate of the ESD switch Te. As there is no DC at the output of the antenna switch Ta, the trigger level can be kept lower (1 to 2V) than in generic ESD trigger circuits (which typically have a trigger level of 3 to 5V). This improves ESD performance considerably. ESD events take already place during assembly or mounting antennas to boards. The ESD protection circuit will be effective without a power supply (battery) connected and also with power supply connected to the transceiver device 1.

At a positive ESD event, the ESD switch Te (NMOS device) starts to conduct and charges fast the gate of the antenna switch Ta. A very short time later the antenna switch Ta starts heavily to conduct the ESD pulse. At a negative ESD event, the large drain to bulk diode of the antenna switch Ta will conduct and limit the ESD voltage.

The trigger impedance Rtrigger has a resistance value in the order of 1 kOhm to 10 kOhm, i.e. high ohmic enough to not attenuate the RF signal provided at the antenna port 2 when a load is connected at 50 Ohm.

A limiting impedance Rlimit is provided in a conductive path of the ESD switch Te to limit the current in the ESD switch Te (NMOS device). The impedance value is relatively small (e.g. about 100 to 500 Ohm). The value of the limiting impedance Rlimit can be determined dependent on capacitance of the NMOS gate (antenna switch Ta) and the speed of the ESD pulse. Typically the antenna switch Ta needs to be enabled in a few nanoseconds. So making this limiting impedance Rlimit too big, will limit the reaction speed. It is noted that the limiting impedance Rlimit is not adding losses at RF as the ESD switch Te is normally off. Only in an ESD event the ESD switch Te will draw current, which current is amplified by the antenna switch Ta. The antenna switch Ta will thus draw the majority (e.g. 99%) of the current during an ESD event.

In the embodiment shown in FIG. 2, furthermore an RF-stop impedance Rrfstop is shown connected to the ESD switch control input A (i.e. the gate of the antenna switch Ta). This has the effect to isolate a DC component from the RF component at the gate of NMOS device implementation of the antenna switch Ta.

The ESD switch Te when implemented as NMOS device may be a 3.6V device, thus a drain-source voltage of up to 3.6V can be allowed. Also the gate to source voltage of 3.6V can be tolerated in the ESD switch Te. With the configuration of ESD switch Te and impedances Rtrigger, Rlimit, Rrfstop present, the ESD switch Te starts to conduct at about 2× (Vgs-Vth), which is in the order of 1.0V. At about 3.6V, both the ESD switch Te and the antenna switch Ta conduct heavily and the on-resistance of the antenna switch Ta is low at about 1 Ohm. A current of about 1 A can be conducted for a short time, which allows rectifying an ESD pulse of even up to 1500V HBM and keeping all Vgs/Vds voltages well under 3.6V. This can occur during a short time, because of thermal constraints, but long enough to conduct an ESD event. Once again it is noted that re-using the NMOS implementation of the antenna switch Ta results in no extra losses by adding this ESD protection circuit. Also the trigger arrangement will not limit the bandwidth of the antenna port 2.

In certain transceiver devices 1, antenna selection diversity is used with multiple antenna ports 2; 2' to improve the link budget and reliability against interferers. With multipath fading conditions a link budget improvement of 10 dB can be expected from a two (or more) antennae system with an antenna diversity circuit. All RF devices where a single transceiver device 1 is required, do benefit from antenna diversity. This includes Bluetooth, ZigBee, GSM, DECT, WiFi, and many other standards.

An embodiment of the present invention where antenna diversity is implemented is shown in the schematic diagram of FIG. 3. The transceiver circuitry 5 is coupled to at least one antenna port 2; 2' (two shown in FIG. 3) by a multiple winding balun arrangement Lb, Lu; Lu'. For each of the at least one antenna port 2; 2' an antenna switch Ta; Ta' is provided in a circuit connection similar to the one shown in the FIG. 2 embodiment (including RF-stop impedances Rrfstop, Rrfstop'). The ESD protection circuit now comprises an ESD switch Te; Te' for each antenna port 2, 2', the ESD switch Te, Te' being arranged to connect the antenna port 2; 2' to the antenna enabling input 4; 4' of the antenna switch Ta; Ta'. Each ESD switch Te; Te' has an associated ESD switch control input, i.e. the gate of ESD switch Te, Te', connected to an ESD trigger arrangement Rtrigger, Rtrigger'. Again, this embodiment does not need any supply power to work as ESD protection.

Figure 4:
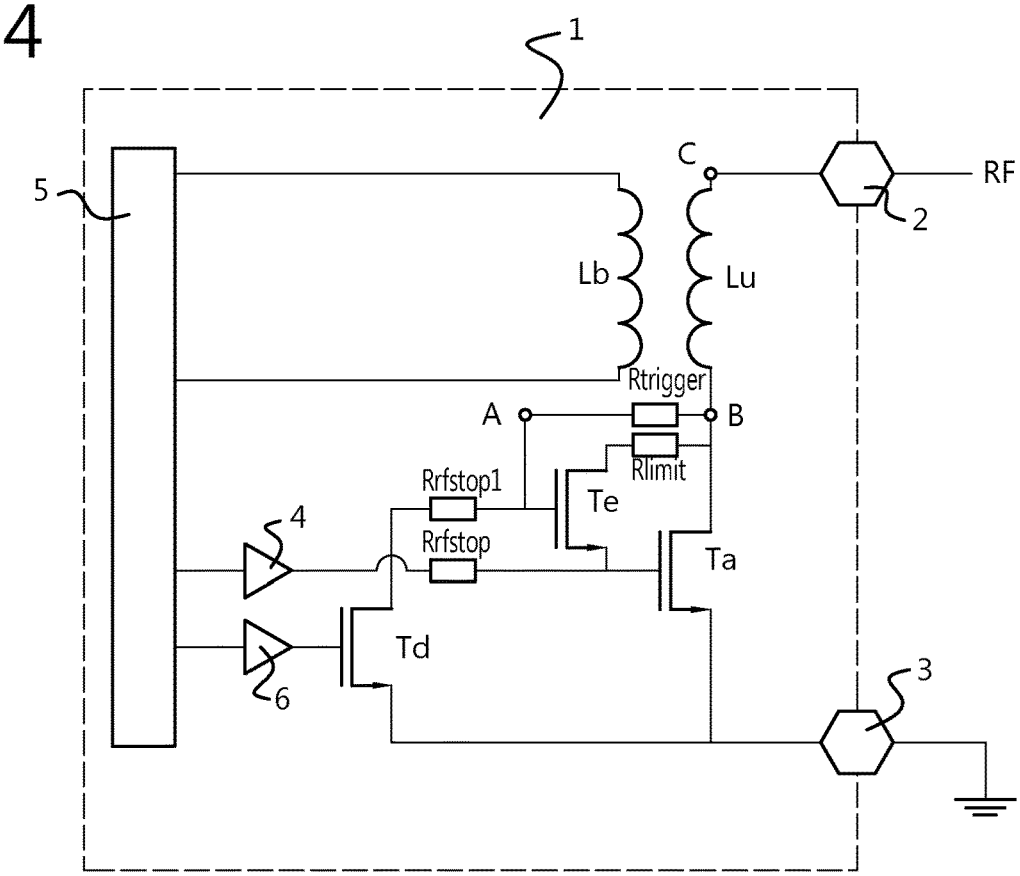
FIG. 4 shows a schematic diagram of a transceiver device provided with an ESD protection circuit according to a third embodiment of the present invention.

FIG. 4 shows a schematic diagram of a transceiver device 1 provided with an ESD protection circuit according to a third embodiment of the present invention, which provides a solution with a capability to disable the ESD protection circuit for very large RF signals (20 dBm or higher) to the antenna port 2. This embodiment is advantageous as it does not add any additional losses at RF, and also without adding significant area and allowing high output powers. As shown in FIG. 4, the ESD protection circuit further comprising an ESD switch disable switch Td (which may also be implemented as an NMOS device) arranged to connect the ground port 3 to the ESD switch control input A of the associated ESD switch Te. Furthermore, as shown in FIG. 4, the ESD switch disable switch Td has a disable control input 6, e.g. implemented as a control output of the transceiver circuitry 5.

When normally using the antenna switch as in the embodiment shown in FIG. 2, there may be no need to protect the antenna switch Ta as it is already conducting when the antenna port 2 is enabled by the antenna switch Ta. However when combining this with an antenna diversity switch like the embodiment of FIG. 3, the non-selected antenna port 2; 2' and the associated antenna switch Ta; Ta'(switch) is open and a large RF voltage may build up on the trigger input. This might actually trigger the ESD protection circuit, and cause unwanted RF power to conduct. The result is a reduced isolation between the two antenna ports 2; 2', which is visible as less power available at the selected antenna port 2; 2' and power coming out of the non-selected antenna port 2; 2'. This effect becomes more visible for larger transmit powers (power levels starting at about +7 dBm). When a large signal is transmitted, the ESD protection circuit may trigger, and to avoid this from happening, the ESD switch Te; Te' can be disabled by pulling ESD switch control input (node A), i.e. the gate of NMOS implementation of the ESD switch Te, Te'. About 1% of the output power is then lost in the trigger impedance Rtrigger, Rtrigger', which however is not noticeable. As in the embodiment of FIGS. 2 and 3, an RF-stop impedance Rrfstop is used to protect the gate of the antenna switch Ta, as well as a secondary RF-stop impedance Rrfstop1 to protect the gate of the ESD switch Te.

The ESD protection implementation can also be disabled when a power supply is connected to the transceiver device 1, thus allowing e.g. high transmit powers without triggering the ESD protection circuit resulting in high harmonics or reduced output power.

Figure 5:
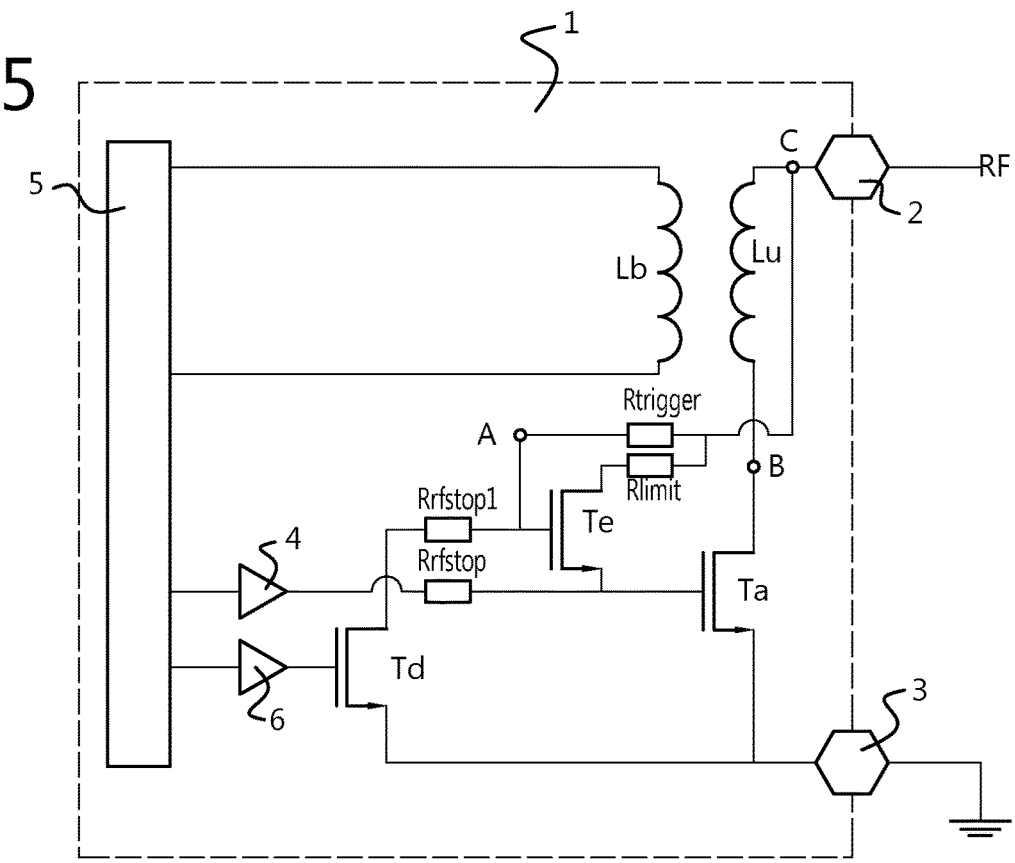
FIG. 5 shows a schematic diagram of a transceiver device provided with an ESD protection circuit according to a fourth embodiment of the present invention.

A further alternative embodiment is shown in the schematic diagram of FIG. 5, which is similar to the FIG. 4 embodiment, with the exception that instead of connecting the trigger impedance Rtrigger and limiting impedance Rlimit to node B, the resistors are connected to node C as indicated in FIG. 5. The ESD trigger arrangement this comprises a trigger impedance Rtrigger connected between a hot side (node C) of the unbalanced coil Lu and the ESD switch control input (node A) of the associated ESD switch Te. The benefit is that the resistance in the coil is skipped for the ESD event on antenna port 2, resulting in more voltage drive signal for both the ESD switch Te and the antenna switch Ta. The overall result is a higher amplification factor, resulting in a lower Vgs/Vds on all NMOS device implemented switches Te, Ta, with the potential to handle even larger ESD events.

It is noted that the trigger impedance Rtrigger between either nodes A and B in the FIG. 4 embodiment, or between nodes A and C in the FIG. 5 embodiment, could comprise various circuit implementations. In its simplest for, the trigger impedance Rtrigger comprises a resistor. Alternatively the trigger impedance is implemented as a capacitor, which would provide a means to combine blocking a DC path and obtain a fast transient response. Even further, a capacitor can be put in series with the resistor Rtrigger (e.g. to block a DC path). In a series configuration, the capacitor could present a high-pass characteristic, which would make it less suitable for low frequency ESD events. To prevent this a capacitor can be put parallel to the resistor Rtrigger, which would be more effective eat high frequency and maintain a DC path.

The present invention has been described above with reference to a number of exemplary embodiments as shown in the drawings. Modifications and alternative implementations of some parts or elements are possible, and are included in the scope of protection as defined in the appended claims. Such modifications and alternative implementations include e.g. embodiments related to transmit and/or receive antenna diversity with more than two antenna ports.

The invention claimed is:

1. A transceiver device comprising
transceiver circuitry coupled to at least one antenna port by a balun arrangement, and for each of the at least one antenna port:
    an antenna switch having an antenna enabling input and arranged to connect an unbalanced coil from the balun arrangement to the antenna port and a ground port, and
    an electro-static discharge (ESD) protection circuit,
the ESD protection circuit comprising an ESD switch arranged to connect the antenna port to the antenna enabling input of the antenna switch,
the ESD switch having an ESD switch control input connected to an ESD trigger arrangement comprising a trigger impedance connected between a cold side of the unbalanced coil and the ESD switch control input of the associated ESD switch.

2. The transceiver device according to claim 1, wherein the antenna switch and ESD switch are semiconductor devices.

3. The transceiver device according to claim 1, wherein the ESD trigger arrangement comprises a trigger impedance connected between a hot side of the unbalanced coil and the ESD switch control input of the associated ESD switch.

4. The transceiver device according to claim 1, wherein the trigger impedance comprises a resistor.

5. The transceiver device according to claim 1, wherein the trigger impedance comprises a capacitor.

6. The transceiver device according to claim 1, further comprising a limiting impedance in a conductive path of the ESD switch.

7. The transceiver device according to claim 1, the ESD protection circuit further comprising an ESD switch disable switch arranged to connect the ground port to the ESD switch control input of the associated ESD switch.

8. The transceiver device according to claim 7, wherein the ESD switch disable switch has a disable control input.

\* \* \* \* \*